(12) United States Patent
Kwon et al.

(10) Patent No.: US 10,145,528 B2
(45) Date of Patent: Dec. 4, 2018

(54) LIGHT EMITTING MODULE

(71) Applicant: LG INNOTEK CO., LTD., Seoul (KR)

(72) Inventors: Ki Soo Kwon, Seoul (KR); Do Yub Kim, Seoul (KR); Min Hak Kim, Seoul (KR); Jae Hun Yoon, Seoul (KR); Seung Beom Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/329,471

(22) PCT Filed: May 4, 2015

(86) PCT No.: PCT/KR2015/004461
§ 371 (c)(1),
(2) Date: Jan. 26, 2017

(87) PCT Pub. No.: WO2016/017905
PCT Pub. Date: Feb. 4, 2016

(65) Prior Publication Data
US 2017/0321863 A1    Nov. 9, 2017

(30) Foreign Application Priority Data
Jul. 30, 2014 (KR) .......................... 10-2014-0097272

(51) Int. Cl.
*H05B 37/02* (2006.01)
*F21S 43/14* (2018.01)
(Continued)

(52) U.S. Cl.
CPC ............... *F21S 43/14* (2018.01); *F21S 41/64* (2018.01); *F21S 43/239* (2018.01);
(Continued)

(58) Field of Classification Search
CPC .......... H05B 2203/019; H05B 2203/02; H05B 2206/023; H05B 2213/07; H05B 6/645; H05B 6/06; H05B 3/08; H05B 1/02
(Continued)

(56) References Cited

U.S. PATENT DOCUMENTS 6,989,807 B2    1/2006  Chiang
2004/0245946 A1  12/2004  Halter
(Continued)

FOREIGN PATENT DOCUMENTS

CN    101330787    12/2008
JP    2003-188415    7/2003
(Continued)

OTHER PUBLICATIONS

International Search Report (with English Translation) and Written Opinion dated Jul. 20, 2015 issued in Application No. PCT/KR2015/004461.
(Continued)

*Primary Examiner* — Wei Chan
(74) *Attorney, Agent, or Firm* — KED & Associates, LLP

(57) ABSTRACT

A light emitting module of an embodiment comprises: $(1-1)^{th}$ to $(1-M)^{th}$ (where M is a positive integer equal to or greater than 2) light emitting elements connected with each other; $(2-1)^{th}$ to $(2-N)^{th}$ (where N is a positive integer equal to or greater than 1) light emitting elements connected in parallel with a $(1-m)^{th}$ ($1 \leq m \leq M$) light emitting elements which is one of the $(1-1)^{th}$ to $(1-M)^{th}$ light emitting elements; and an on/off controller controlling to turn the $(1-1)^{th}$ to $(1-M)^{th}$ light emitting elements and $(2-1)^{th}$ to $(2-N)^{th}$ light emitting elements on or off according to a level of an operation signal. The on/off controller comprises a first on/off control unit controlling to turn the $(1-m)^{th}$ light emitting element and $(2-1)^{th}$ to $(2-N)^{th}$ light emitting ele-
(Continued)

ments on or off, and a second on/off control unit controlling to turn the remaining light emitting elements on or off, excluding the $(1\text{-}m)^{th}$ light emitting element from the $(1\text{-}1)^{th}$ to $(1\text{-}M)^{th}$ light emitting elements, wherein the first on/off control unit compensates for a change in a second current flowing in the $(2\text{-}1)^{th}$ to $(2\text{-}N)^{th}$ light emitting elements, depending on the temperature, in conjunction with a first current flowing in the $(1\text{-}m)^{th}$ light emitting element.

20 Claims, 13 Drawing Sheets

(51) Int. Cl.
    *H01L 33/48*     (2010.01)
    *F21S 43/239*     (2018.01)
    *F21S 41/64*     (2018.01)
    *H01L 25/075*     (2006.01)
    *H05B 33/08*     (2006.01)
    *G08G 1/095*     (2006.01)
    *G09G 3/20*     (2006.01)

(52) U.S. Cl.
    CPC .......... *H01L 25/0753* (2013.01); *H01L 33/48* (2013.01); *H05B 33/08* (2013.01); *H05B 33/083* (2013.01); *G08G 1/095* (2013.01); *G09G 3/2003* (2013.01)

(58) Field of Classification Search
    USPC .............................. 315/401, 32, 50, 112–118
    See application file for complete search history.

(56) References Cited

U.S. PATENT DOCUMENTS

2010/0225220 A1*   9/2010   Tanaka .................. F21V 31/005
                                                            313/46
2011/0068701 A1     3/2011   van de Ven et al.
2011/0068702 A1*   3/2011   van de Ven .......... H05B 33/083
                                                            315/186
2012/0262074 A1*   10/2012   Wang .................... H05B 33/083
                                                            315/186
2012/0262075 A1    10/2012   Lynch et al.
2013/0314001 A1    11/2013   Liu et al.
2014/0210363 A1*   7/2014   Lynch ................. H05B 33/0818
                                                            315/186
2014/0217899 A1*   8/2014   Kang, II .............. H05B 33/083
                                                            315/122
2014/0312777 A1*   10/2014   Shearer .............. H05B 33/0869
                                                            315/151
2015/0008834 A1*   1/2015   Leung ................ H05B 33/0809
                                                           315/187
2015/0115819 A1*   4/2015   Park ................... H05B 33/0815
                                                           315/193

FOREIGN PATENT DOCUMENTS

| JP | 2005-129598 | 5/2005 |
| --- | --- | --- |
| JP | 2007-324493 | 12/2007 |
| JP | 2011-114249 | 6/2011 |
| KR | 10-2008-0112503 | 12/2008 |
| KR | 10-2014-0053748 | 5/2014 |
| WO | WO 2013/118208 | 8/2013 |

OTHER PUBLICATIONS

European Search Report dated Jan. 2, 2018 issued in Application No. 15827829.1.

Chinese Office Action dated Apr. 4, 2018 issued in Application No. 201580041588.8 (with English translation).

* cited by examiner

[FIG. 1]

[FIG. 3A]
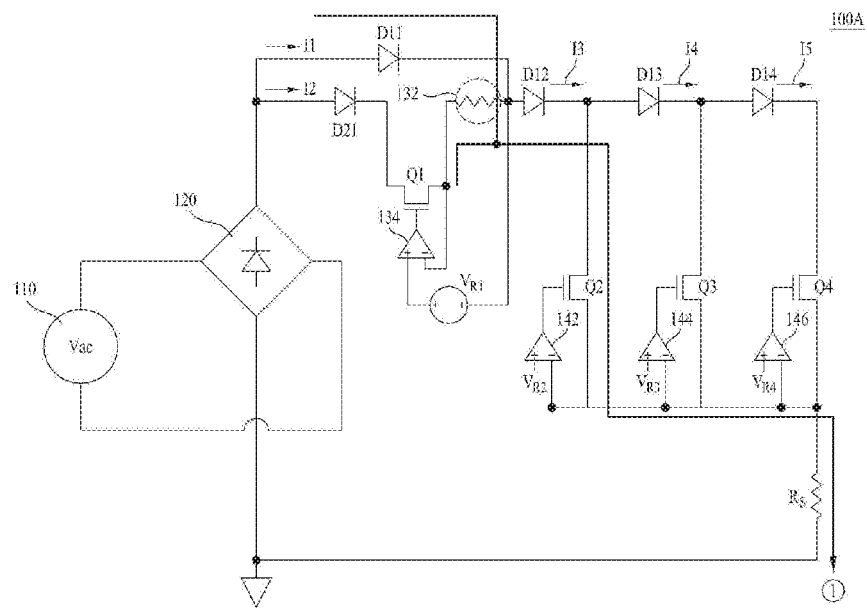
[FIG. 3B]
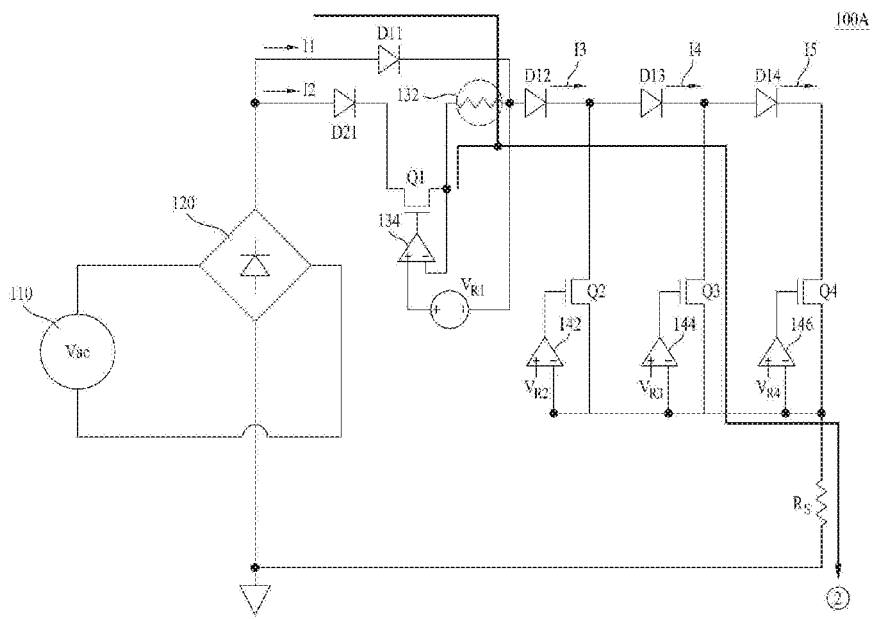

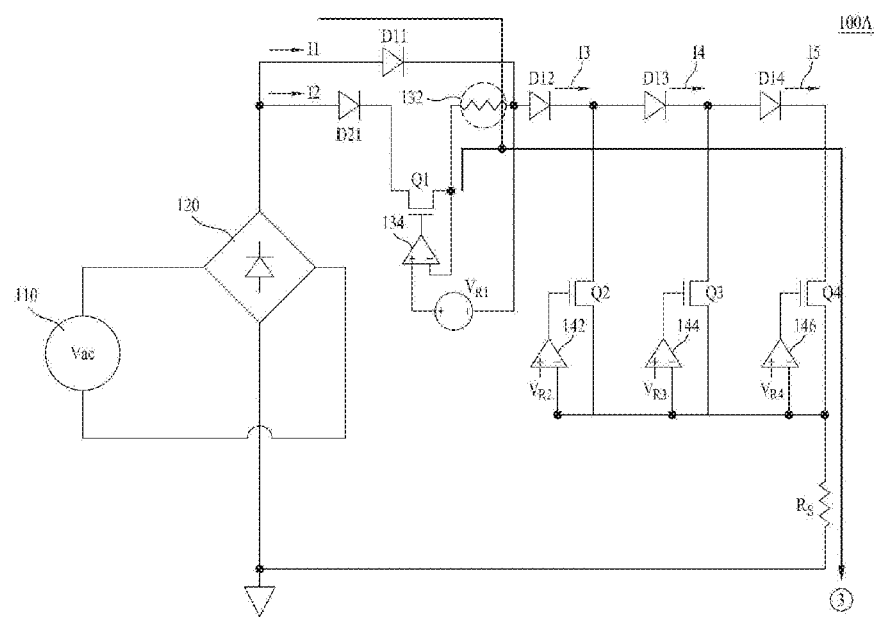
[FIG. 3C]

[FIG. 4A]
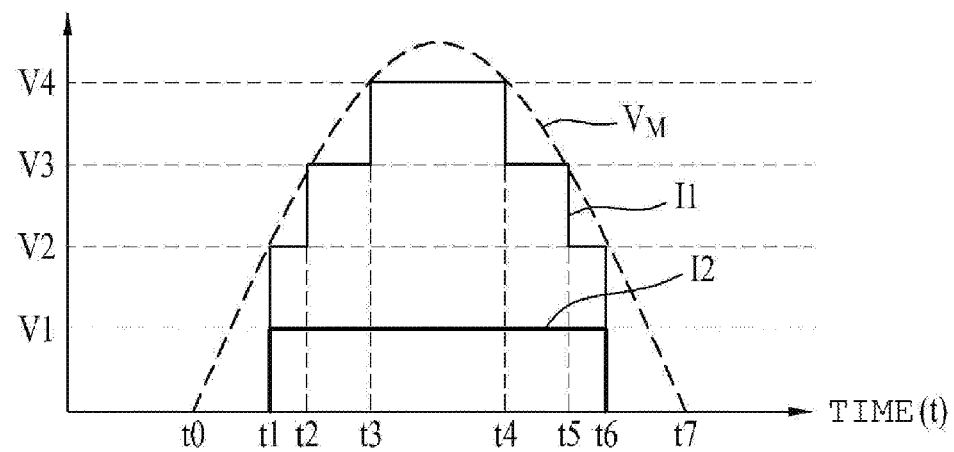
[FIG. 4B]
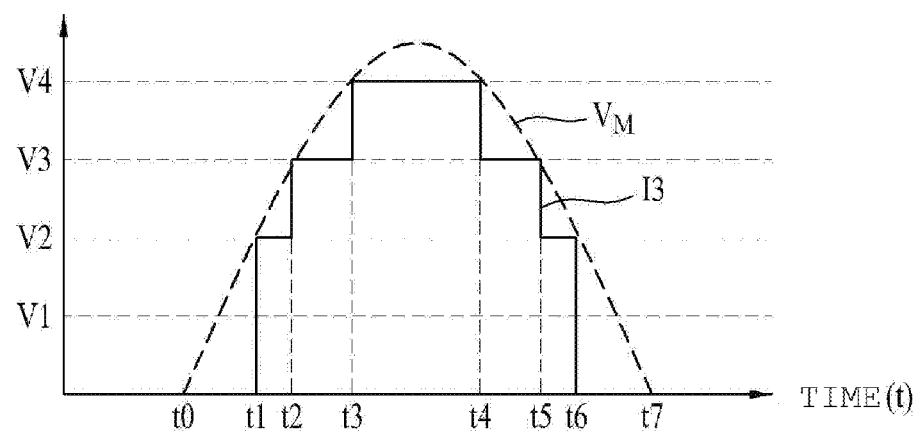

[FIG. 4C]
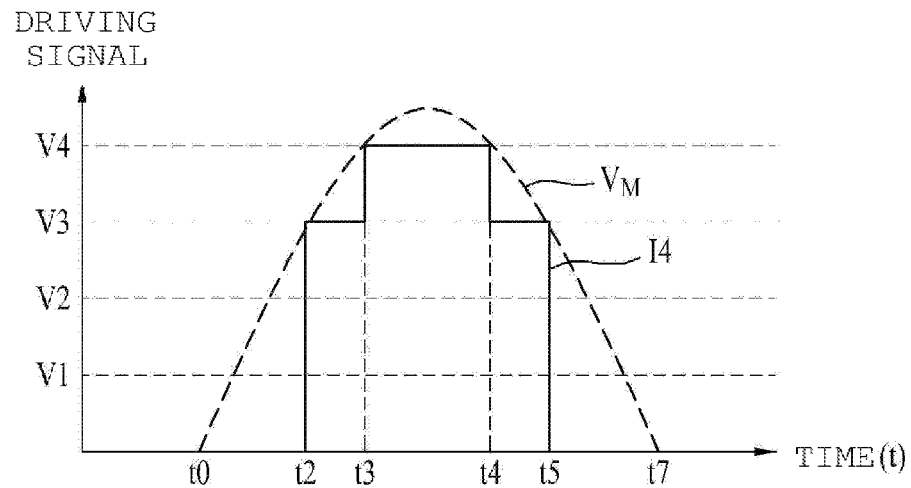
[FIG. 4D]
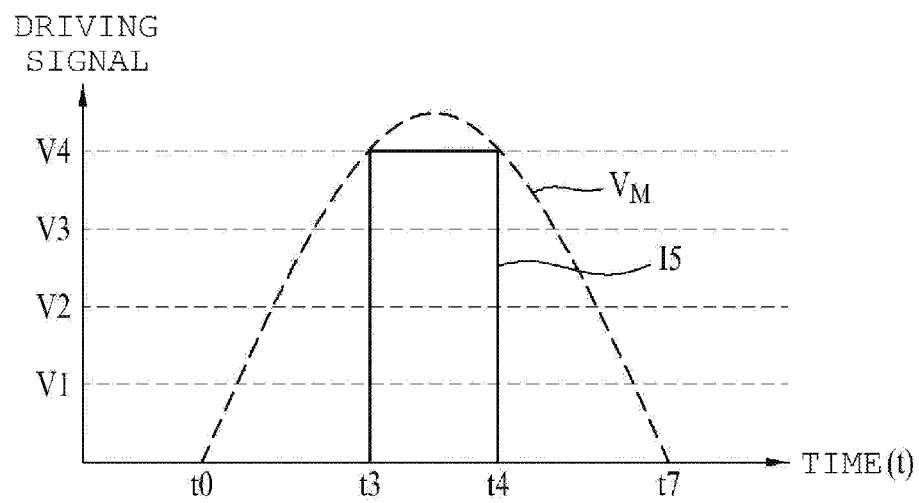

[FIG. 5A]
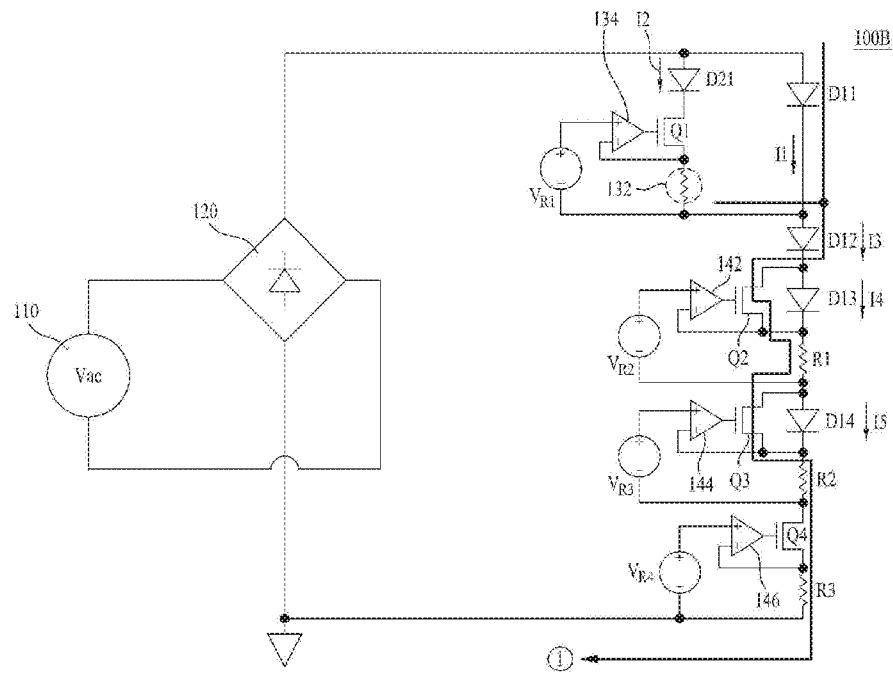
[FIG. 5B]
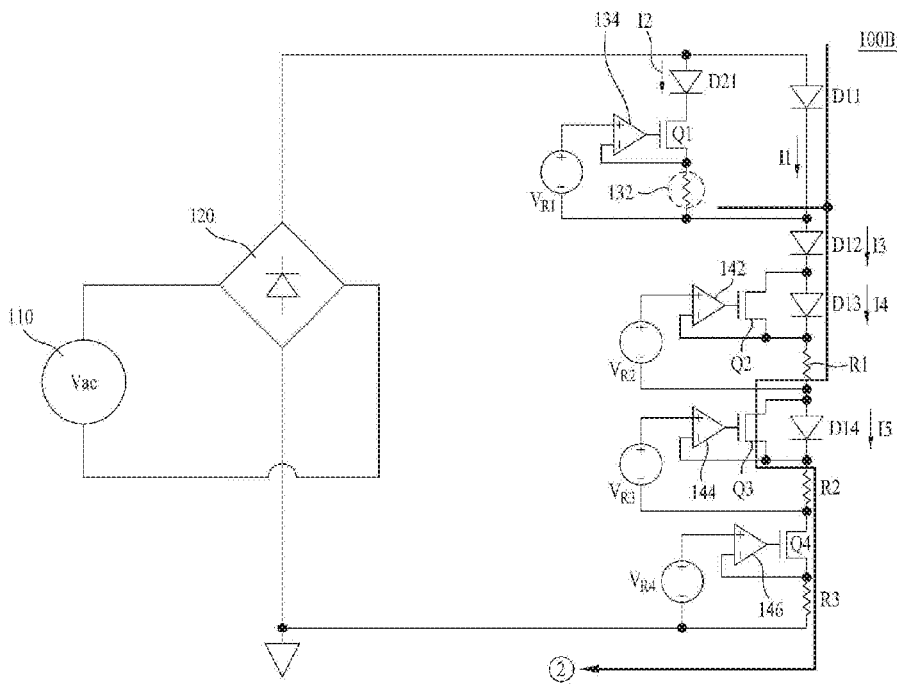

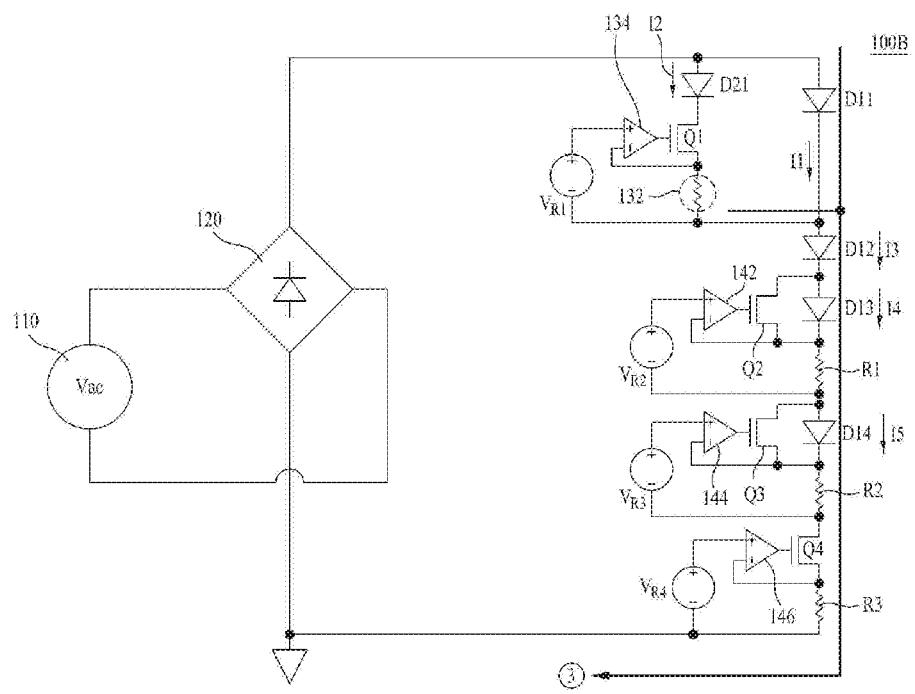
[FIG. 5C]

[FIG. 6A]
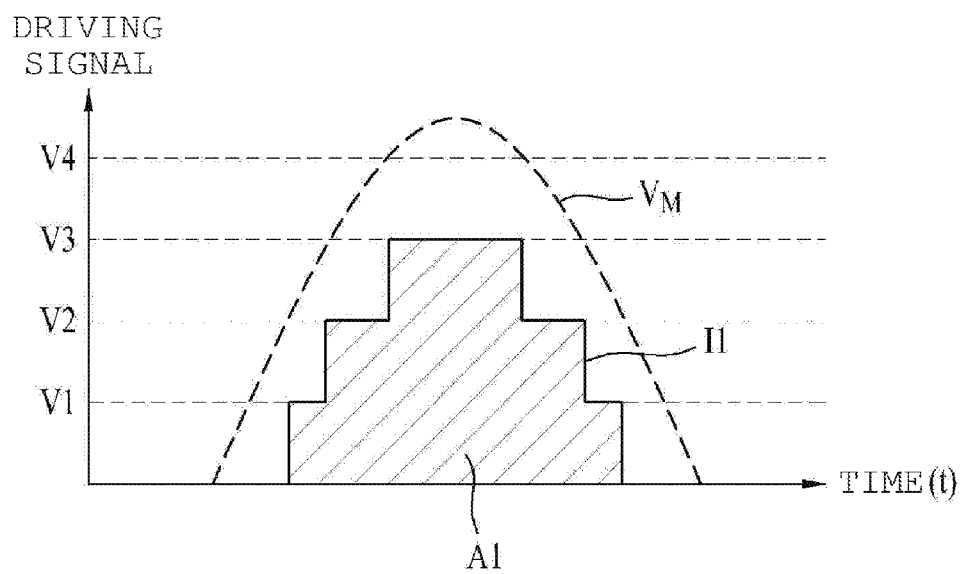
[FIG. 6B]
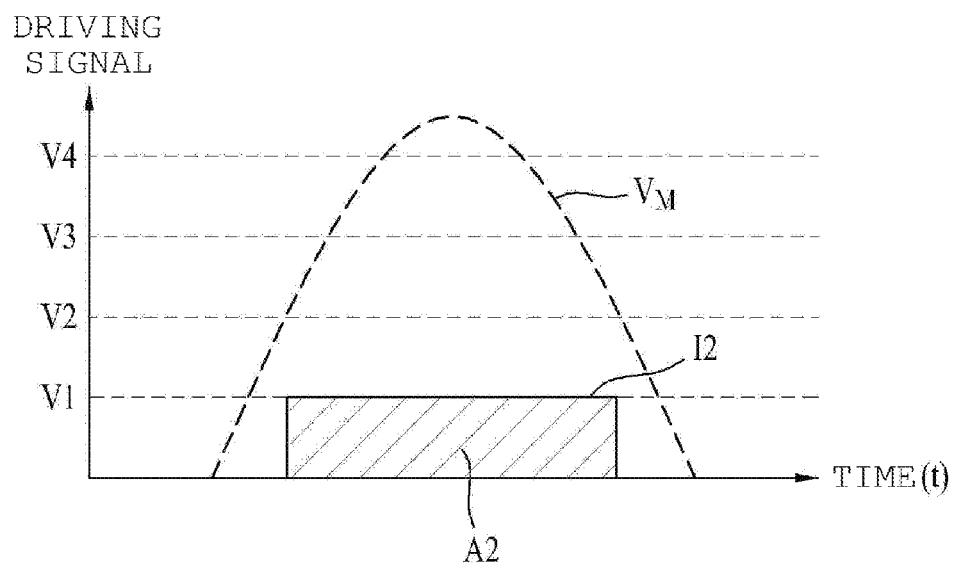

[FIG. 7A]
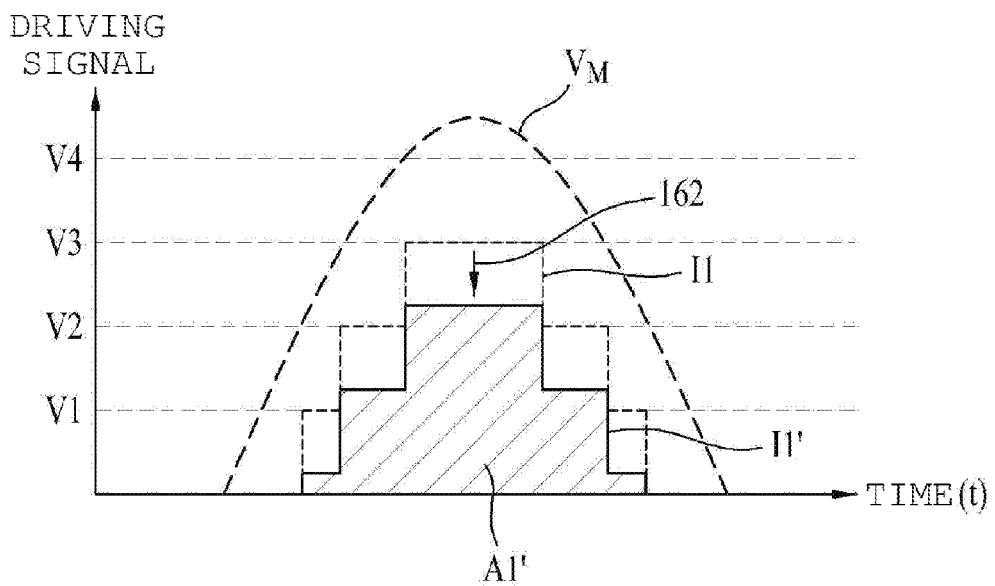
[FIG. 7B]
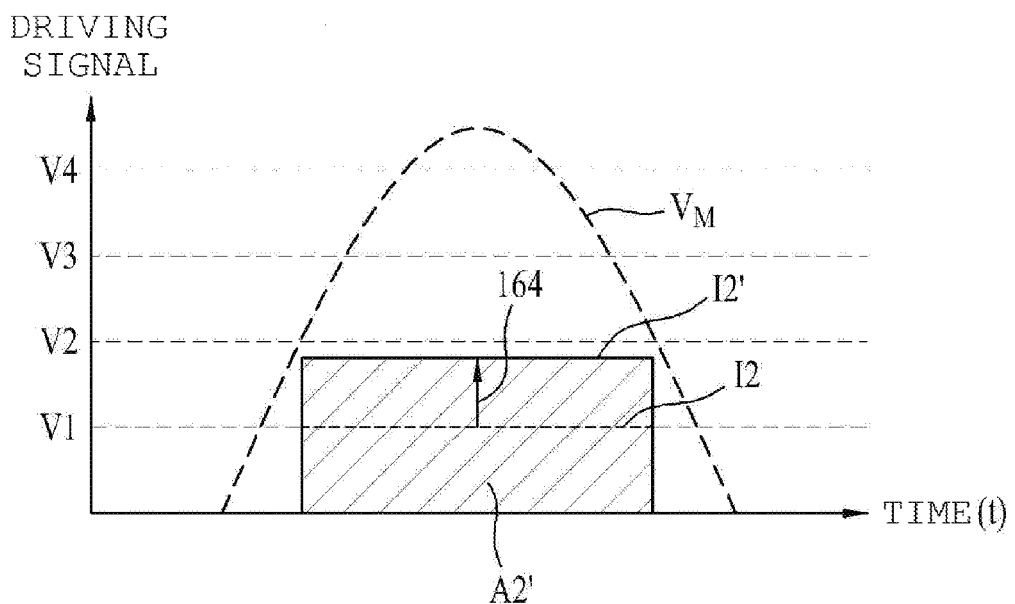

[FIG. 8]
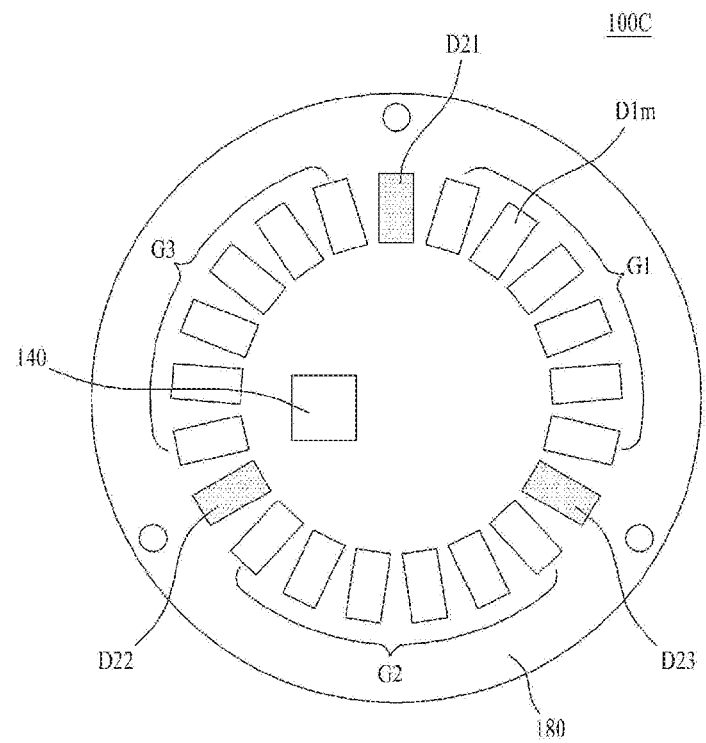
[FIG. 9]
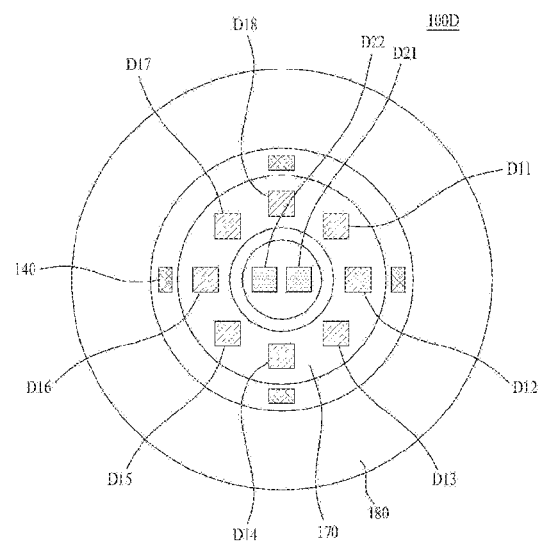

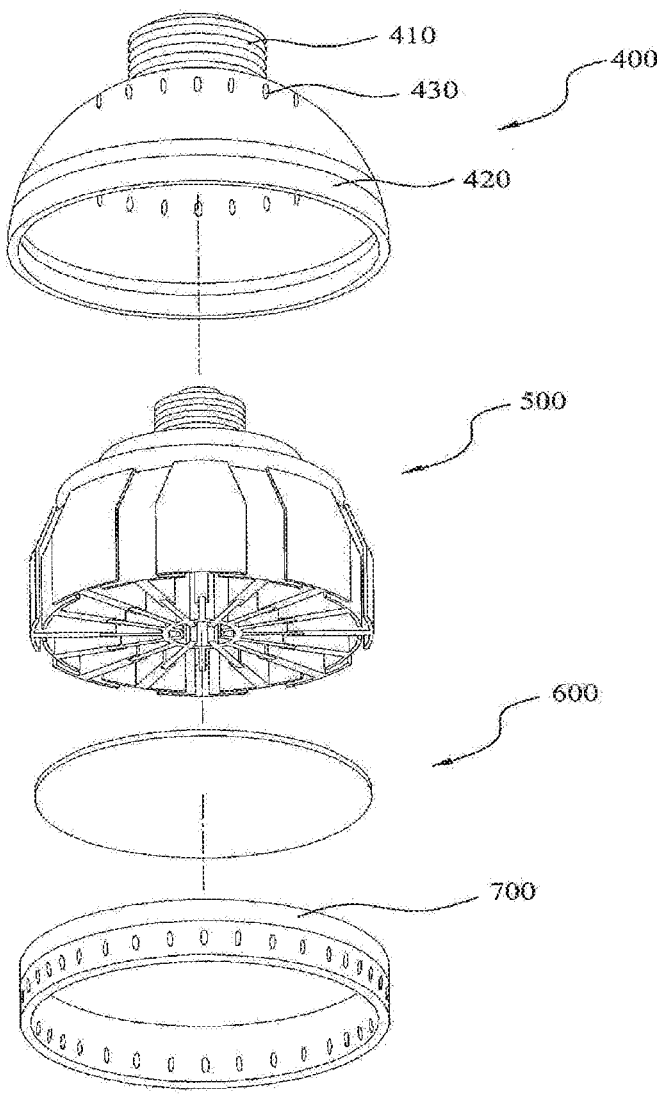
[FIG. 10]

[FIG. 11]
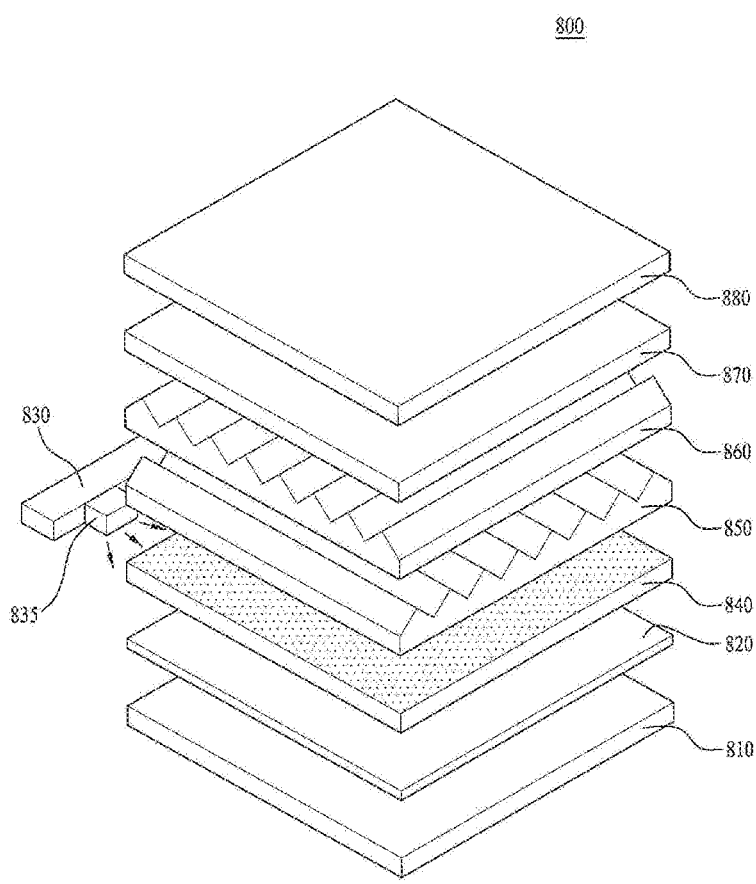

LIGHT EMITTING MODULE

This application is a U.S. National Stage Application under 35 U.S.C. § 371 of PCT Application No. PCT/PCT/KR2015/004461, filed May 4, 2015, which claims priority to Korean Patent Application No. 10-2014-0097272, filed Jul. 30, 2014, whose entire disclosures are hereby incorporated by reference.

TECHNICAL FIELD

Embodiments relate to a light-emitting module.

BACKGROUND ART

The efficiency of light-emitting diodes (LEDs) has greatly increased owing to the development of semiconductor technology. Thus, LEDs have several advantages including a longer lifespan, reduced energy consumption, higher economical efficiency, and greater environmental friendliness, compared to a conventional lighting apparatus such as incandescent lamps or fluorescent lamps. Due to these advantages, currently, LEDs are in the spotlight as a light source capable of serving as a substitute therefor in traffic lights, backlights of flat-panel displays such as liquid crystal displays (LCDs), and the like.

Generally, when an LED is used as a lighting apparatus, a light-emitting module is comprised of a plurality of LEDs connected in series or parallel with one another, and control elements for controlling the turn-on and turn-off operation of the LEDs.

A conventional light-emitting module separately provides a channel for a red LED, in addition to a white LED, in order to realize a high color rendering index (CRI). Any one LED driving device included in the conventional light-emitting module is disclosed in U.S. Pat. No. 6,989,807. However, in the case of the disclosed LED driving device, the output of light from the red LED is reduced as the temperature increases, which may make it impossible to provide a high CRI.

DISCLOSURE

Technical Problem

Embodiments provide a light-emitting module capable of maintaining consistent color coordinates despite an increase in temperature, thereby being capable of realizing a high color rendering index.

Technical Solution

An embodiment provides a light-emitting module including (1-1)st to (1-M)th light-emitting elements connected to one another (where, "M" is a positive integer that is equal to or greater than 2), (2-1)st to (2-N)th light-emitting elements connected in parallel with a (1-m)th light-emitting element (1≤m≤M), which is one of the (1-1)st to (1-M)th light-emitting elements (where, "N" is a positive integer that is equal to or greater than 1), and an on/off controller for controlling to turn the (1-1)st to (1-M)th light-emitting elements and the (2-1)st to (2-N)th light-emitting elements on or off based on a level of a driving signal, wherein the on/off controller includes a first on/off control unit for controlling to turn the (1-m)th light-emitting element and the (2-1)st to (2-N)th light-emitting elements on or off, and a second on/off control unit for controlling to turn the remaining light-emitting elements on or off, excluding the (1-m)th light-emitting element, among the (1-1)st to (1-M)th light-emitting elements, and wherein the first on/off control unit compensates for variation in second current, which flows through the (2-1)st to (2-N)th light-emitting elements, depending on temperature, in connection with first current, which flows through the (1-m)th light-emitting element.

The first on/off control unit may include a thermistor connected in parallel with the (1-m)th light-emitting element, a first level comparator for comparing a level of the driving signal with a level of a first reference voltage, and a first current controller for forming a path, along which current flows from the (2-1)st to (2-N)th light-emitting elements to the thermistor in response to a result of the comparison by the first level comparator.

The first current controller may include a first transistor, and the first transistor may include a drain connected to a cathode of the (2-N)th light-emitting element, a gate associated with the result of the comparison by the first level comparator, and a source connected to the thermistor.

The second on/off control unit may include second to Mth level comparators for comparing the driving signal with second to Mth reference voltages, and second to Mth current controllers, each of which forms a path, along which current flows from the (1-1)st to (1-M)th light-emitting elements to a reference potential, in response to results of comparisons by the second to Mth level comparators.

The light-emitting module may further include a sensing resistor connected between the second to Mth current controllers and the reference potential.

The second to Mth current controllers may include second to Mth transistors respectively, and each of the second to Mth transistors may include a drain connected to a cathode of a corresponding light-emitting element of the remaining light-emitting elements excluding the (1-m)th light-emitting element among the (1-1)st to (1-M)th light-emitting elements, a gate associated with a result of a comparison by a corresponding level comparator among the second to Mth level comparators, and a source connected to the sensing resistor.

The second on/off control unit may include second to Mth level comparators for comparing the driving signal with second to Mth reference voltages, second to (M−1)st current controllers, each of which bypasses a path, along which current flows to at least some of the remaining light-emitting elements excluding the (1-m)th light-emitting element among the (1-1)st to (1-M)th light-emitting elements, in response to results of comparisons by the second to Mth level comparators, and an Mth current controller for forming a path, along which current flows from the (1-M)th light-emitting element to a reference potential, in response to a result of a comparison by the Mth level comparator. In addition, the light-emitting module may further include a sensing resistor connected between the Mth current controller and the reference potential.

The light-emitting module may further include a connection resistor connected to an output of at least some of the remaining light-emitting elements excluding the (1-m)th light-emitting element among the (1-1)st to (1-M)th light-emitting elements.

The second to Mth current controllers may include second to Mth transistors respectively, and each of the second to (M−1)st transistors may include a drain and a source respectively connected to an anode and a cathode of at least some of the remaining light-emitting elements excluding the (1-m)th light-emitting element among the (1-1)st to (1-M−1)st light-emitting elements, and a gate associated with a result of a comparison by a corresponding level comparator among the second to (M−1)st level comparators.

The Mth transistor may include a drain and a source connected respectively to a cathode of the (1-M)th light-emitting element and the reference potential, and a gate associated with a result of a comparison by the Mth level comparator.

The (1-1)st to (1-M)th light-emitting elements may be connected in series with each other, and the (2-1)st to (2-N)th light-emitting elements may be connected in series with each other.

The (1-m)th light-emitting element may be turned on first, among the (1-1)st to (1-M)th light-emitting elements.

The (1-1)st to (1-M)th light-emitting elements may emit greenish white light, and the (2-1)st to (2-N)th light-emitting elements may emit red light.

The first to Mth level comparators and the first to Mth current controllers may form an integrated circuit in integral form.

The light-emitting module may further include a rectifier for rectifying the driving signal, which is of an alternating current (AC) type, and converting the driving signal into a ripple driving signal. The rectifier may include a full-wave diode bridge circuit for converting the AC-type driving signal into the ripple driving signal.

The (1-1)st to (1-M)th light-emitting elements may be arranged in a circular plan form.

The (2-1)st to (2-N)th light-emitting elements may be equidistantly arranged between the (1-1)st to (1-M)th light-emitting elements arranged in the circular plan form, or may be disposed inside a circular plan in which the (1-1)st to (1-M)th light-emitting elements are disposed.

The light-emitting module may further include a sensing resistor connected between the Mth current controller and the reference potential.

Advantageous Effects

A light-emitting module according to an embodiment may prevent a reduction in the output of red light due to variation in temperature using a thermistor, thereby achieving a high color rendering index of 90 or more and providing consistent color reproducibility at low costs, resulting in high efficiency thereof.

DESCRIPTION OF DRAWINGS

FIGS. 3A to 3C illustrate the case where (1-1)st to (1-4)th light-emitting elements and a (2-1)st light-emitting element illustrated in FIG. 1 are turned on.

FIGS. 4A to 4D illustrate the waveform of a driving voltage VM and the waveform of current flowing to the (1-1)st to (1-4)th light-emitting elements depending on variation in the level of a driving signal.

FIGS. 5A to 5C illustrate the case where (1-1)st to (1-4)th light-emitting elements and a (2-1)st light-emitting element illustrated in FIG. 2 are turned on.

FIGS. 6A and 6B are graphs respectively illustrating first current and second current at room temperature of 25° C.

FIGS. 7A and 7B are graphs respectively illustrating first current and second current at a temperature of 60° C.

FIG. 8 illustrates a plan view of a light-emitting module according to one embodiment.

FIG. 9 illustrates a plan view of a light-emitting module according to another embodiment.

FIG. 10 is an exploded perspective view illustrating one embodiment of a lighting apparatus including the light-emitting module according to the embodiment.

FIG. 11 is an exploded perspective view illustrating one embodiment of a display apparatus including the light-emitting module according to the embodiment.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In addition, relative terms such as, for example, "first", "second", "on/upper/above" and "beneath/lower/below", used in the following description may be used to distinguish any one substance or element from another substance or element without requiring or implying any physical or logical relationship or sequence between these substances or elements.

Figure 1:
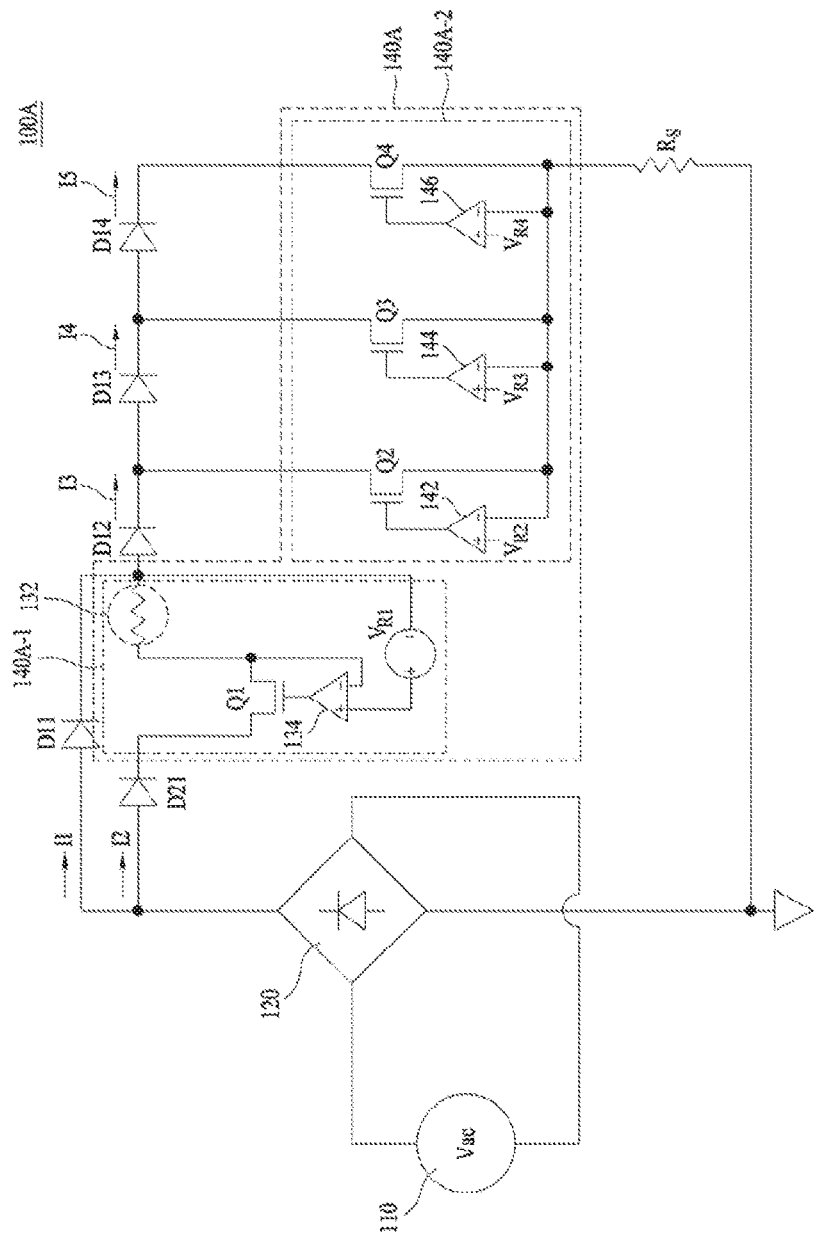
FIG. 1 illustrates a circuit diagram of a light-emitting module according to one embodiment.

FIG. 1 illustrates a circuit diagram of a light-emitting module 100A according to one embodiment.

The light-emitting module 100A illustrated in FIG. 1 may include an alternating-current (AC) power supply 110, a rectifier 120, an on/off controller 140A, (1-1)st to (1-M)th light-emitting elements, and (2-1)st to (2-N)th light-emitting elements. Here, "M" is a positive integer that is equal to or greater than 2, and "N" is a positive integer that is equal to or greater than 1. Although FIG. 1 corresponds to the case where "M" is 4 and "N" is 1, the embodiment is not limited thereto. That is, "M" may be above or below 4, and "N" may be above 1.

The AC power supply 110 supplies an AC-type driving signal. At this time, the AC-type driving signal may be an AC-type driving voltage Vac having a root-mean-square value of 100 V or 200 V and a frequency ranges from 50 Hz to 60 Hz.

Although not illustrated, a fuse may be located between the AC power supply 110 and the rectifier 120. The fuse may serve to protect the (1-1)st to (1-4)th light-emitting elements D11, D12, D13, D14 and the (2-1)st light-emitting element D21 illustrated in FIG. 1 from an instantaneous voltage spike in the AC-type driving signal. That is, as the fuse is opened at the instantaneous voltage spike in an input AC-type driving signal, the (1-1)st to (1-4)th light-emitting elements D11, D12, D13, D14 and the (2-1)st light-emitting element D21 may be protected.

The rectifier 120 rectifies the AC-type driving signal provided from the AC power supply 110, and outputs the rectified result as a ripple driving signal. For example, the rectifier 120 may be realized by a full-wave diode bridge circuit that rectifies an AC-type driving signal to convert the same into the ripple driving signal. The full-wave diode bridge circuit is generally known, and thus a detailed description thereof is omitted.

In addition, although not illustrated, the light-emitting module 100A may further include a smoothing unit located between the rectifier 120 and the (1-1)st light-emitting device D11. The smoothing unit may smoothen the ripple driving signal rectified in the rectifier 120 to convert the same into a direct-current (DC) type driving signal.

Hereinafter, in FIG. 1, for convenience, although the light-emitting module 100A described below includes no smoothing unit so that the ripple driving signal rectified in the rectifier 120 is supplied to the (1-1)st to (1-4)th light-emitting elements D11, D12, D13, D14 and the (2-1)st light-emitting element D21, the embodiment is not limited thereto.

Meanwhile, the (1-1)st to (1-M)th light-emitting elements may be connected in series or parallel with one another. For example, when "M" is 4, as illustrated in FIG. 1, the light-emitting module 100A may include the (1-1)st to (1-4)th light-emitting elements D11, D12, D13, D14, which are connected in series to one another.

In addition, the (2-1)st to (2-N)th light-emitting elements may be connected in series or parallel with one another. For example, when "N" is 1, as illustrated in FIG. 1, the light-emitting module 100A may include the (2-1)st light-emitting element D21. In addition, the (2-1)st to (2-N)th light-emitting elements may be connected in parallel with a (1-m)th light-emitting element, which is one of the (1-1)st to (1-M)th light-emitting elements. Here, the relationship 1≤m≤M must be satisfied. For example, referring to FIG. 1, when "m" is 1, the (2-1)st light-emitting element D21 may be connected in parallel with the (1-1)st light-emitting element D11.

Each of the (1-1)st to (1-4)th light-emitting elements D11, D12, D13, D14 and the (2-1)st light-emitting element D21 described above may be a light-emitting device package and may include at least one light-emitting diode (LED). The LED may include a colored LED, which emits colored light of red, green, blue, or white, and an ultraviolet (UV) LED, which emits UV light. In addition, the LED may have a horizontal, vertical, or flip-chip bonding structure.

According to the embodiment, as illustrated in FIG. 1, although the (1-m)th light-emitting element may be the (1-1)st light-emitting element D11, which is first turned on among the (1-1)st to (1-M)th light-emitting elements, the embodiment is not limited thereto.

For example, when "N" and "m" are 1, as illustrated in FIG. 1, although the (2-1)st light-emitting element D21 may be connected in parallel with the (1-1)st light-emitting element D11, the embodiment is not limited thereto. That is, according to another embodiment, "N" may be 1 and "m" may be 2. In this case, unlike the illustration of FIG. 1, the (2-1)st light-emitting element D21 may be connected in parallel with the (1-2)nd light-emitting element D12.

Meanwhile, the on/off controller 140A may control to turn the (1-1)st to (1-4)th light-emitting elements and the (2-1)st to (2-N)th light-emitting elements on or off depending on the level of the ripple driving signal. For example, when "M" is 4 and "N" is 1, as illustrated in FIG. 1, the on/off controller 140A may control to turn the (1-1)st to (1-4)th light-emitting elements D11, D12, D13, D14 on or off, and may also control to turn the (2-1)st light-emitting element D21 on or off.

The on/off controller 140A may include first and second on/off control units 140A-1 and 140A-2.

The first on/off control unit 140A-1 controls to turn the (1-m)th light-emitting element and the (2-1)st to (2-N)th light-emitting elements on or off. For example, when "N" and "m" are 1, the first on/off control unit 140A-1 may control to turn the (1-1)st light-emitting element D11 and the (2-1)st light-emitting element D21 on or off as illustrated in FIG. 1.

The first on/off control unit 140A-1 may compensate for variation in second current I2, which flows through the (2-1)st to (2-N)th light-emitting elements, depending on temperature, in connection with first current I1, which flows through the (1-m)th light-emitting element. For example, when "N" and "m" are 1, the first on/off control unit 140A-1 may compensate for variation in the second current I2, which flows through the (2-1)st light-emitting element D21, depending on temperature, in connection with the first current I1, which flows through the (1-1)st light-emitting element D11.

For description convenience, in FIG. 1, it is defined that first, third, fourth and fifth current I1, I3, I4, I5 flows through the (1-1)st, (1-2)nd, (1-3)rd and (1-4)th light-emitting elements D11, D12, D13, D14, and the second current I2 flows through the (2-1)st light-emitting element D21.

According to the embodiment, as illustrated in FIG. 1, the first on/off control unit 140A-1 may include a thermistor 132, a first level comparator 134, and a first current controller Q1.

The thermistor 132 may be connected in parallel with the (1-m)th light-emitting element (e.g. the (1-1)st light-emitting element D11). The first level comparator 134 compares the level of the ripple driving signal with the level of a first reference voltage VR1, and outputs a result of comparison into the first current controller Q1. The first level comparator 134, as illustrated in FIG. 1, may be realized as an operational (OP) amplifier that compares the two signals in an analogue form with each other. The first current controller Q1 forms a path, along which current flows from the (2-1)st to (2-N)th light-emitting elements (e.g. D21) to the thermistor 132, depending on the result of comparison by the first level comparator 134. To this end, the first current controller Q1 may be realized as a first transistor. The first transistor Q1 may be realized as, for example, a bipolar transistor or a field effect transistor (EFT). When the first current controller Q1 is realized as a field effect transistor, the first transistor Q1 may include a drain, a gate and a source. The drain of the first transistor Q1 is connected to a cathode of the (2-N)th light-emitting element (e.g. the (2-1)st light-emitting element D21), and the source is connected to the thermistor 132. The gate is connected to a result of comparison by the first level comparator 134.

Meanwhile, the second on/off control unit 140A-2 controls to turn the remaining light-emitting elements on or off excluding the (1-m)th light-emitting element among the (1-1)st to (1-M)th light-emitting elements. For example, when "M" is 4 and "m" is 1, the second on/off control unit 140A-2 controls to turn at least some of the remaining light-emitting elements D12, D13, D14 on or off excluding the (1-1)st light-emitting element D11 among the (1-1)st to (1-4)th light-emitting element D11, D12, D13, D14.

To this end, the second on/off control unit 140A-2 may include second to Mth level comparators and second to Mth current controllers. For example, when "M" is 4, the second on/off control unit 140A-2 may include second to fourth level comparators 142, 144, 146 and second to fourth current controllers Q2, Q3, Q4. Here, the first to Mth level comparators and the first to Mth current controllers may form an integrated circuit in integral form.

The second to Mth level comparators may compare the ripple driving signal with second to Mth reference voltages VR2, VR3, VR4, . . . , VRM. For example, when "M" is 4, the second level comparator 142 compares the level of the driving signal with the level of the second reference voltage VR2, and outputs the comparison result to the second current controller Q2. The third level comparator 144 compares the level of the driving signal with the level of the third reference voltage VR3, and outputs a result of comparison to the third current controller Q3. The fourth level comparator 146 compares the level of the driving signal with the level of the fourth reference voltage VR4, and outputs a result of comparison to the fourth current controller Q4. Here, the levels relation of the first to fourth reference voltages VR1, VR2, VR3, VR4 may be the same as the following Equation 1.

$$VR1 < VR2 < VR3 < VR4 \qquad \text{Equation 1}$$

The second to Mth current controllers respectively form paths, along which current flows from at least some of the remaining light-emitting elements excluding the (1-m)th light-emitting element among the (1-1)st to (1-M)th light-emitting elements to a reference potential (e.g. a ground), in response to the results of comparison by the second to Mth level comparators.

For example, when "M" is 4 and "m" is 1, as illustrated in FIG. 1, the second to fourth current controllers Q2, Q3, Q4 control the formation of paths, along which current flows from the (1-1)st to (1-4)th light-emitting elements D11, D12, D13, D14 to a reference potential.

That is, the path, along which current flows from the (1-1)st to (1-2)nd light-emitting elements D11, D12 to the reference potential, may be formed under the control of the second current controller Q2. The path, along which current flows from the (1-1)st to (1-3)rd light-emitting elements D11, D12, D13 to the reference potential, may be formed under the control of the third current controller Q3. The path, along which current flows from the (1-1)st to (1-4)th light-emitting elements D11, D12, D13, D14 to the reference potential, may be formed under the control of the fourth current controller Q4.

To this end, the second to Mth current controllers may respectively be realized as second to Mth bipolar transistors or second to Mth field effect transistors. As shown in FIG. 1, the respective second to fourth current controllers Q1, Q2, Q3, Q4 are realized as field effect transistors.

Each of the second to Mth current controllers, which are realized as field effect transistors, may include a drain, which is connected to a cathode of the remaining light-emitting element excluding the (1-m)th light-emitting element among the (1-1)st to (1-M)th light-emitting elements, a gate, which is associated with a result of comparison by a corresponding level comparator among the second to Mth level comparators, and a source, which is connected to one side of a sensing resistor RS.

That is, referring to FIG. 1, when "M" is 4 and "m" is 1, the field effect transistor, which realizes the second current controller Q2, may include a drain, which is connected to a cathode of the corresponding light-emitting element D12 among the remaining light-emitting elements D12, D13, D14 excluding the (1-1)st light-emitting element D11 among the (1-1)st to (1-4)th light-emitting elements D11, D12, D13, D14, a gate, which is associated with a result of comparison by the corresponding second level comparator 142 among the second to fourth level comparators 142, 144, 146, and a source, which is connected to one side of the sensing resistor RS. Similarly, the field effect transistor, which realizes the third current controller Q3, may include a drain connected to a cathode of the (1-3)rd light-emitting element D13, a gate associated with a result of comparison by the third level comparator 144, and a source connected to one side of the sensing resistor RS. In addition, the field effect transistor, which realizes the fourth current controller Q4, may include a drain connected to a cathode of the (1-4)th light-emitting element D14, a gate associated with a result of comparison by the fourth level comparator 146, and a source connected to one side of the sensing resistor RS.

The light-emitting module 100A may further include the sensing resistor RS. One side of the sensing resistor RS may be connected to the second to Mth current controllers as described above, and the other side of the sensing resistor RS may be connected to the reference potential.

Figure 2:
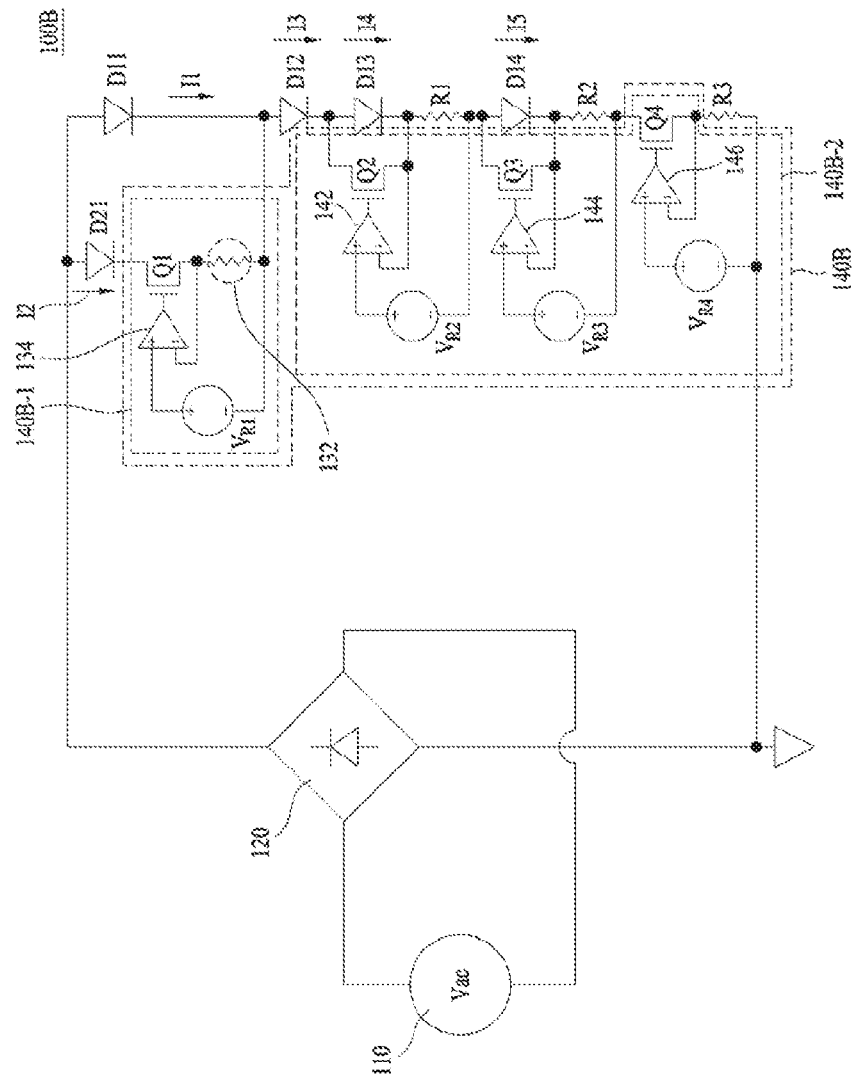
FIG. 2 illustrates a circuit diagram of a light-emitting module according to another embodiment.

FIG. 2 illustrates a circuit diagram of a light-emitting module 100B according to another embodiment.

The light-emitting module 100B illustrated in FIG. 2 may include the AC power supply 110, the rectifier 120, a on/off controller 140B, the (1-1)st to (1-M)th light-emitting elements, and the (2-1)st to (2-N)th light-emitting elements. In the same manner as FIG. 1, the light-emitting module 100B illustrated in FIG. 2 corresponds to the case where "M" is 4 and "N" is 1.

The AC power supply 110, the rectifier 120, the (1-1)st to (1-4)th light-emitting elements D11, D12, D13, D14, and the (2-1)st light-emitting element D21 illustrated in FIG. 2 respectively correspond to the AC power supply 110, the rectifier 120, the (1-1)st to (1-4)th light-emitting elements D11, D12, D13, D14, and the (2-1)st light-emitting element D21 illustrated in FIG. 1, and thus, are designated by the same reference numerals, and a repeated description thereof is omitted below.

The light-emitting module 100A illustrated in FIG. 1 may include the sensing resistor RS, whereas the light-emitting module 100B illustrated in FIG. 2 may include connection resistors R1, R2, R3, which are connected to the output of at least some D13, D14 of the remaining light-emitting elements D12, D13, D14 excluding the $(1-1)^{st}$ light-emitting element (D11 when "m" is 1) among the (1-1)st to (1-4)th light-emitting elements D11, D12, D13, D14. The first connection resistor R1 may be connected to a cathode that is the output of the (1-3)rd light-emitting element D13, and the second connection resistor R2 may be connected in series to a cathode that is the output of the (1-4)th light-emitting element D14. The third connection resistor R3 may perform the same role as the sensing resistor RS illustrated in FIG. 1.

The on/off controller 140B illustrated in FIG. 2 may include a first on/off control unit 140B-1 and a second on/off control unit 140B-2.

The configuration of the first on/off control unit 140B-1 is the same as the configuration of the first on/off control unit 140A-1 illustrated in FIG. 1, and thus a repeated description thereof is omitted. However, the configuration of the second on/off control unit 140B-2 is partially different from the configuration of the second on/off control unit 140A-2 illustrated in FIG. 1. This will be described below.

The second on/off control unit 140B-2 controls to turn the remaining light-emitting elements on or off excluding the (1-m)th light-emitting element among the (1-1)st to (1-M)th light-emitting elements. For example, when "M" is 4 and "m" is 1, the second on/off control unit 140B-2 controls to turn the remaining light-emitting elements D12, D13, D14 on or off excluding the (1-1)st light-emitting element D11 among the (1-1)st to (1-4)th light-emitting elements D11, D12, D13, D14.

To this end, the second on/off control unit 140B-2 may include second to Mth level comparators and second to Mth current controllers. For example, when "M" is 4, the second on/off control unit 140B-2 may include the second to fourth level comparators 142, 144, 146 and the second to fourth current controllers Q2, Q3, Q4.

The second to Mth level comparators may compare a driving signal with second to Mth reference voltages. For example, when "M" is 4, the second to fourth level comparators 142, 144, 146 perform the same role as the second to fourth level comparators 142, 144, 146 illustrated in FIG. 1, and thus a repeated description thereof is omitted.

The second to (M−1)st current controllers respectively bypass paths, along which current flows to at least some of the remaining light-emitting elements excluding the (1-m)th light-emitting element among the (1-1)st to (1-M−1)st light-emitting elements, in response to the results of comparison by the second to (M−1)st level comparators. For example, when "M" is 4 and "m" is 1, as illustrated in FIG. 2, each of the second and third current controllers Q2, Q3 may bypass a path, along which current flows to at least one D13 or D14 of the (1-2)nd to (1-4)th light-emitting elements D12, D13, D14 excluding the (1-1)st light-emitting element D11. That is, the second current controller Q2 may bypass the current path so that no current flows to the (1-3)rd light-emitting element D13 in response to the result of comparison by the second level comparator 142, and the third current controller Q3 may bypass the current path so that no current flows to the (1-4)th light-emitting element D14 in response to the result of comparison by the third level comparator 144.

In addition, the Mth current controller may form a path, along which current flows from the (1-M)th light-emitting element to a reference potential, in response to the result of comparison by the Mth level comparator. That is, when "M" is 4, the fourth current controller Q4 may form a path, along which current flows from the (1-4)th light-emitting element D14 to a reference potential, in response to the result of comparison by the fourth level comparator 146.

To this end, the second to Mth current controllers may respectively be realized as second to Mth bipolar transistors or second to Mth field effect transistors. FIG. 2 illustrates the case where each of the first to fourth current controllers Q1, Q2, Q3, Q4 is realized as field effect transistors.

The field effect transistor realizing each of the second to (M−1)st current controllers may include a drain and a source, which are respectively connected to an anode and a cathode of at least some light-emitting elements excluding the (1-m)th light-emitting element among the (1-1)st to (1-M)th light-emitting elements, and a gate, which is associated with a result of comparison by a corresponding level comparator among the second to (M−1)st level comparators. That is, as illustrated in FIG. 2, when "M" is 4 and "m" is 1, the field effect transistor Q2, which corresponds to the second current controller Q2, may include a drain and a source, which are respectively connected to an anode and a cathode of at least one D13 of the light-emitting elements D12, D13, D14 excluding the (1-1)st light-emitting element D11 among the (1-1)st to (1-4)th light-emitting elements D11, D12, D13, D14, and a gate, which is associated with a result of comparison by the corresponding second level comparator 142 among the second to fourth level comparators 142, 144, 146. Similarly, the field effect transistor Q3, which corresponds to the third current controller Q3, may include a drain and a source, which are respectively connected to an anode and a cathode of the remaining one D14 of the light-emitting elements D12, D13, D14 excluding the (1-1)st light-emitting element D11 among the (1-1)st to (1-4)th light-emitting elements D11, D12, D13, D14, and a gate, which is associated with a result of comparison by the third level comparator 144.

In addition, the Mth transistor may include a drain and a source, which are respectively connected to a cathode of the (1-M)th light-emitting element and the reference potential, and a gate, which is associated with a result of comparison by the Mth level comparator. For example, when "M" is 4, the fourth transistor Q4 may include a drain and a source, which are respectively connected to a cathode of the (1-4)th light-emitting element D14 and the reference potential, and a gate, which is associated with a result of comparison by the fourth level comparator 146.

Hereinafter, an operation of the light-emitting module 100A illustrated in FIG. 1 will be described with reference to the accompanying drawings. For description convenience, it is assumed that "M" is 4 and "N" and "m" are 1.

FIGS. 3A to 3C illustrate the case where the (1-1)st to (1-4)th light-emitting elements D11, D12, D13, D14 and the (2-1)st light-emitting element D21 illustrated in FIG. 1 are turned on.

FIGS. 4A to 4D illustrate the waveform of a driving voltage VM and the waveform of current flowing to the (1-1)st to (1-4)th light-emitting elements D11, D12, D13, D14 depending on variation in the level of a driving signal. In FIGS. 4A to 4D, the horizontal axis represents time, and the vertical axis represents the ripple driving voltage VM and the first current I1, the second current I2, the third current I3, the fourth current I4, and the fifth current I5, each of which flows through each of light-emitting elements D11, D21, D12, D13, and D14.

The turn-on and turn-off operation of the (1-1)st to (1-4)th light-emitting elements D11, D12, D13, D14 and the (2-1)st light-emitting element D21 will be described below with reference to FIG. 1 and FIGS. 4A to 4D as well as FIGS. 3A to 3C.

First, while the level of the ripple driving signal VM increases to V1 at $t0 \leq t < t1$, no first to fifth current I1, I2, I3, I4, I5 flows. Thus, all of the (1-1)st to (1-4)th light-emitting elements D11, D12, D13, D14 and the (2-1)st light-emitting element D21 are turned off. At this time, the first current controller Q1 is turned off, whereas the second to fourth current controllers Q2, Q3, Q4 are turned on.

Thereafter, as illustrated in FIG. 4A, when the level of the ripple driving signal VM reaches V1 at t=t1, the first current controller Q1 is turned on so that the second current I2 of a constant level flows to the (2-1)st light-emitting element D21 and the first current I1 flows to the (1-1)st light-emitting element D11. Thereafter, when the level of the driving signal VM reaches V2, as illustrated in FIG. 4B, the third current I3 flows to the (1-2)nd light-emitting element D12. Thus, as illustrated in FIG. 3a, the (1-1)st and (1-2)nd light-emitting elements D11, D12 and the (2-1)st light-emitting element D21, which are located on the path ①, along which the first, second and third current I1, I2, I3 flows, are turned on. The (1-3)rd and (1-4)th light-emitting elements D13, D14, to which no fourth and fifth current I4 and I5 flows, remain in the turned-off state. At this time, the second to fourth current controllers Q2, Q3, Q4 continuously remain in the turned-on state.

Thereafter, as illustrated in FIG. 4C, when the level of the ripple driving signal VM reaches V3 at t=t2, the second current controller Q2 is turned off so that the fourth current flows to the (1-3)rd light-emitting element D13. Thus, as illustrated in FIG. 3B, the (1-1)st, (1-2)nd, and (1-3)rd light-emitting elements D11, D12, D13 and the (2-1)st light-emitting element D21, which are located on the path ②, along which the first, second, third and fourth current I1, I2, I3, I4 flows, are turned on. The (1-4)th light-emitting elements D14, to which no fifth current I5 flows, remains in the turned-off state. At this time, the third and fourth current controllers Q3, Q4 continuously remain in the turned-on state.

Thereafter, as illustrated in FIG. 4D, when the level of the ripple driving signal VM reaches V4 at t=t3, the third current controller Q3 is turned off. At this time, the second current controller Q2 remains in the turned-off state. Thus, the fifth current I5 flows to the (1-4)th light-emitting element D14. In this case, as illustrated in FIG. 3C, the (1-1)st, (1-2)nd, (1-3)rd and (1-4)th light-emitting elements D11, D12, D13, D14 and the (2-1)st light-emitting element D21, which are located on the path ③, along which the first, second, third, fourth and fifth current I1, I2, I3, I4, I5 flows, are turned on. At this time, the fourth current controller Q4 continuously remains in the turned-on state.

The light-emitting module 100A operates as described above at t0≤t≤t3 during which the level of the ripple driving signal VM increases to V4. Thereafter, the light-emitting module 100A operates at t4≤t≤t7 during which the level of the ripple driving signal VM decreases from V4 to 0, contrary to the aforementioned operation at t0≤t≤t3 of the light-emitting module 100A, and thus a detailed description thereof is omitted.

Hereinafter, an operation of the light-emitting module 100B illustrated in FIG. 2 will be described with reference to the accompanying drawings. For description convenience, it is assumed that "M" is 4 and "N" and "m" are 1. In addition, for description convenience, in FIG. 2, it is defined that the first, third, fourth and fifth current I1, I3, I4, I5 flows through the (1-1)st, (1-2)nd, (1-3)rd and (1-4)th light-emitting elements D11, D12, D13, D14, and the second current I2 flows through the (2-1)st light-emitting element D21.

FIGS. 5A to 5C illustrate the case where the (1-1)st to (1-4)th light-emitting elements D11, D12, D13, D14 and the (2-1)st light-emitting element D21 illustrated in FIG. 2 are sequentially turned on.

The turn-on and turn-off operation of the (1-1)st to (1-4)th light-emitting elements D11, D12, D13, D14 and the (2-1)st light-emitting element D21 will be described below with reference to FIG. 2 and FIGS. 5A to 5C.

First, while the level of the ripple driving signal VM increases to V1 at t0≤t≤t1, no first to fifth current I1, I2, I3, I4, I5 flows. Thus, all of the (1-1)st to (1-4)th light-emitting elements D11, D12, D13, D14 and the (2-1)st light-emitting element D21 are turned off. At this time, the first current controller Q1 is turned off, whereas the second to fourth current controllers Q2, Q3, Q4 are turned on.

Thereafter, as illustrated in FIG. 4A, when the level of the ripple driving signal VM reaches V1 at t=t1, the first current controller Q1 is turned on so that the second current I2 of a constant level flows to the (2-1)st light-emitting element D21 and the first current I1 flows to the (1-1)st light-emitting element D11. Thereafter, when the level of the driving signal VM reaches V2, as illustrated in FIG. 4b, the third current I3 flows to the (1-2)nd light-emitting element D12. Thus, as illustrated in FIG. 5a, the (1-1)st and (1-2)nd light-emitting elements D11, D12 and the (2-1)st light-emitting element D21, which are located on the path ①, along which the first, second and third current I1, I2, I3 flows, are turned on. Also, the (1-3)rd and (1-4)th light-emitting elements D13, D14, to which no fourth and fifth current I4 and I5 flows, remain in the turned-off state. At this time, the second to fourth current controllers Q2, Q3, Q4 continuously remain in the turned-on state. As such, the turned-on second and third current controllers Q2 and Q3 bypass the current path so that no current flows to the (1-3)rd and (1-4)th light-emitting elements D13, D14.

Thereafter, as illustrated in FIG. 4C, when the level of the ripple driving signal VM reaches V3 at t=t2, the second current controller Q2 is turned off so that the fourth current flows to the (1-3)rd light-emitting element D13. Thus, as illustrated in FIG. 5b, the (1-1)st, (1-2)nd, and (1-3)rd light-emitting elements D11, D12, D13 and the (2-1)st light-emitting element D21, which are located on the path ②, along which the first, second, third and fourth current I1, I2, I3, I4 flows, are turned on. Also, the (1-4)th light-emitting elements D14, to which no fifth current I5 flows, remains in the turned-off state. At this time, the third and fourth current controllers Q3, Q4 continuously remain in the turned-on state. As such, the turned-on third current controller Q3 bypasses the current path so that no current flows to the (1-4)th light-emitting elements D14.

Thereafter, as illustrated in FIG. 4D, when the level of the ripple driving signal VM reaches V4 at t=t3, the third current controller Q3 is turned off. At this time, the second current controller Q2 remains in the turned-off state. Thus, the fifth current I5 flows to the (1-4)th light-emitting element D14. Accordingly, as illustrated in FIG. 5C, the (1-1)st, (1-2)nd, (1-3)rd and (1-4)th light-emitting elements D11, D12, D13, D14 and the (2-1)st light-emitting element D21, which are located on the path ③, along which the first, second, third, fourth and fifth current I1, I2, I3, I4, I5 flows, are turned on. At this time, the fourth current controller Q4 continuously remains in the turned-on state.

The light-emitting module 100B operates as described above at t0≤t≤t3 during which the level of the ripple driving signal VM increases to V4. Thereafter, the light-emitting module 100B operates at t4≤t≤t7 during which the level of the ripple driving signal VM decreases from V4 to 0, contrary to the aforementioned operation at t0≤t≤t3 of the light-emitting module 100B, and thus a detailed description thereof is omitted.

Hereinafter, variation in the first and second current I1, I2 according to variation in temperature in the light-emitting modules 100A, 100B illustrated in FIGS. 1 and 2 will be described with reference to the accompanying drawings.

FIGS. 6A and 6B are graphs respectively illustrating the first and second current I1, I2 at room temperature of 25° C., and FIGS. 7A and 7B are graphs respectively illustrating first and second current I1', I2' at a temperature of 60° C. Here, in FIGS. 6A, 6B, 7A and 7B, the area of portions represented by deviant crease lines are respectively defined as A1, A2, A1', A2'.

When the temperature increases from room temperature (25° C.) to 60° C., the resistance value of the thermistor 132 illustrated in FIGS. 1 and 2 decreases. Thus, the level of the second current I2, illustrated in FIG. 6B, increases to the level illustrated in FIG. 7B in the arrow direction 164. That is, as the temperature increases, the level of the second current I2 increases in the arrow direction 164 owing to the thermistor 132. At this time, the level of the first current I1 illustrated in FIG. 6A decreases in the arrow direction 162 as illustrated in FIG. 7A.

In conclusion, the entire area does not vary despite variation in temperature, as represented by the following Equation 2.

$$TA = A1 \times A2 = A1' \times A2' \qquad \text{Equation 2}$$

Here, TA indicates the entire area.

It is assumed that the (1-1)st to (1-4)th light-emitting elements D11, D12, D13, D14 emit greenish white light and the (2-1)st light-emitting element D21 emits red light. A conventional light-emitting module emits less red light as temperature increases. Here, for example, the greenish white light may be generated when a green phosphor is disposed on a chip that emits blue light.

On the other hand, referring to FIGS. 7A and 7B, the light-emitting modules 100A and 100B according to the embodiments increase the second current I2 and decrease the first current I1 as temperature increases. Thus, the (2-1)st light-emitting element D21, which emits red light, maintains consistent light emission, despite an increase in temperature. Accordingly, the light-emitting modules 100A, 100B may continuously emit red light of a constant level.

Hereinafter, the plan view of the above-described light-emitting modules 100A, 100B illustrated in FIGS. 1 and 2 according to the embodiment will be described with reference to the accompanying drawings.

FIG. 8 illustrates a plan view of a light-emitting module 100C according to one embodiment.

Referring to FIG. 8, the light-emitting module 100C includes first, second and third light-emitting groups G1, G2, G3, (2-1)st to (2-3)rd light-emitting elements D21, D22, D23, the on/off controller 140, and a board 180. FIG. 8 assumes the case where "N" is 3 and "M" is 18.

Each of the first, second and third light-emitting groups G1, G2, G3 may be disposed on the circuit board 180, and may include the (1-1)st to (1-M)th light-emitting elements illustrated in FIG. 1 or 2. At this time, although the (1-1)st to (1-M)th light-emitting elements of each of the first, second and third light-emitting groups G1, G2, G3 may be arranged in a circular plan form, the embodiment is not limited thereto. In this case, the (2-1)st to (2-3)rd light-emitting elements D21, D22, D23 may be equidistantly arranged between the first to third light-emitting groups G1, G2, G3, which are arranged in a circular plan form.

Here, the circuit board 180 may be formed by printing a circuit pattern on an insulator. For example, the circuit board 180 may be a printed circuit board (PCB), a metal core PCB, a flexible PCB, or a ceramic PCB.

In addition, referring to FIG. 8, the on/off controller 140 may be located inside the circular planar arrangement of the (1-1)st to (1-M)th light-emitting elements. The on/off controller 140 corresponds to the on/off controller 140A or 140B illustrated in FIG. 1 or 2.

FIG. 9 illustrates a plan view of a light-emitting module 100D according to another embodiment.

Referring to FIG. 9, the light-emitting module 100D may include (1-1)st to (1-8)th light-emitting elements D11, D12, D13, D14, D15, D16, D17, D18, (2-1)st and (2-2)nd light-emitting elements D21, D22, a molding member 170, the circuit board 180, and the on/off controller 140.

Here, the (1-1)st to (1-8)th light-emitting elements D11, D12, D13, D14, D15, D16, D17, D18 correspond to the (1-1)st to (1-M)th light-emitting elements illustrated in FIG. 1 or 2, and represent the case where "M" is 8.

In addition, the (2-1)st and (2-2)nd light-emitting elements D21, D22 correspond to the (2-1)st and (2-N)th light-emitting elements illustrated in FIG. 1 or 2, and represents the case where "N" is 2. Unlike the (2-1)st to (2-3)rd light-emitting elements D21, D22, D23 illustrated in FIG. 8, the (2-1)st and (2-2)nd light-emitting elements D21, D22 illustrated in FIG. 9 may be located inside the circular planar arrangement of the (1-1)st to (1-8)th light-emitting elements D11, D12, D13, D14, D15, D16, D17, D18.

As described above, the circuit board 180 illustrated in FIG. 9 is the same as the circuit board 180 illustrated in FIG. 8 excluding difference in the arrangement relationship of the light-emitting elements, and thus a repeated description thereof is omitted.

In addition, the light-emitting modules 100C and 100D may be classified into any one of various kinds based on the light-emitting form and the manufacturing method thereof, and the form of a board used therein. For example, the light-emitting module 100D illustrated in FIG. 9 may be realized in a chip on board (COB) form, or may be realized in a package on board (POB) form.

In addition, the molding member 170 illustrated in FIG. 9 may be disposed over the circuit board 180 to cover the (1-1)st to (1-8)th light-emitting elements D11, D12, D13, D14, D15, D16, D17, D18 so as to enclose and protect the respective light-emitting elements. At this time, the on/off controller 140 may not be covered with the molding member 170. In addition, the molding member 170 may include a phosphor to change the wavelength of light emitted from the (1-1)st to (1-8)th light-emitting elements D11, D12, D13, D14, D15, D16, D17, D18.

The light-emitting module 100C or 100D illustrated in FIG. 8 or 9 may emit white light. To this end, the (1-1)st to (1-M)th light-emitting elements may emit greenish white light, and the (2-1)st to (2-N)th light-emitting elements may emit red light. Alternatively, when the (1-1)st to (1-M)th light-emitting elements emit blue and green light and the (2-1)st to (2-N)th light-emitting elements emit red light, the light-emitting module 100C or 100D may emit mixed white light. Alternatively, when the (1-1)st to (1-M)th light-emitting elements emit blue, green, and yellow light and the (2-1)st to (2-N)th light-emitting elements emit red light, the light-emitting module 100C or 100D may emit the mixed white light.

In order to allow the light-emitting module of the embodiment to have a high color rendering index (CRI) of 90 or more, a separate channel for a light-emitting element that emits red light, in addition to light-emitting elements that emit white (or greenish white) light, is additionally required. In this case, the optical output of the red light-emitting element tends to be reduced as temperature increases. However, each of the light-emitting modules 100A, 100B, 100C and 100D of the embodiments uses the thermistor for splitting current to the (1-1)st light-emitting element D11 and the (2-1)st to (2-N)th light-emitting elements and for causing consistent current to flow to the (2-1)st to (2-N)th light-emitting elements, which emit red light, regardless of temperature. This, the light-emitting module may maintain consistent color coordinates despite variation in temperature.

The light-emitting modules 100A, 100B, 100C, 100D of the above-described embodiments may be applied to various fields, such as a lighting apparatus or a display apparatus.

FIG. 10 is an exploded perspective view illustrating an embodiment of a lighting apparatus including the light-emitting module according to the embodiment.

The lighting apparatus according to the embodiment includes a light-emitting module 600 for projecting light, a housing 400 in which the light-emitting module 600 is accommodated, a radiator 500 for radiating heat from the light-emitting module 600, and a holder 700 for coupling the light-emitting module 600 and the radiator 500 to the housing 400.

The housing 400 includes a socket-coupling portion 410, which is coupled to an electric socket (not illustrated), and a body portion 420, which is connected to the socket-coupling portion 410 and accommodates the light-emitting module 600 therein. The body portion 420 may have one airflow through-hole 430 formed therein.

A plurality of airflow through-holes 430 may be formed in the body portion 420 of the housing 400. That is, one airflow through-hole 430 may be provided, a plurality of airflow through-holes 430 may be radially arranged as shown, or various other arrangements may be possible.

The light-emitting module 600 includes a light-emitting device package and a controller, and may correspond to the light-emitting module 100A, 100B, 100C or 100D illustrated in FIG. 1, 2, 8 or 9. The light-emitting module 600 may be shaped so as to be inserted into an opening in the housing 400, and may be formed of a highly thermally conductive material in order to transfer heat to the radiator 500 as will be described below.

The holder 700 may be provided below the light-emitting module, and may include a frame and another airflow through-hole. In addition, although not illustrated, an optical member may be provided below the light-emitting module 600 so as to diffuse, scatter or converge light projected from the light-emitting module 600.

FIG. 11 is an exploded perspective view illustrating an embodiment of a display apparatus 800 including the light-emitting module according to the embodiment.

Referring to FIG. 11, the display apparatus 800 according to the embodiment includes a light-emitting module 830 and 835, a reflector 820 on a bottom cover 810, a light guide plate 840 located in front of the reflector 820 for guiding light emitted from the light-emitting module to the front side of the display apparatus, a first prism sheet 850 and a second prism sheet 860 located in front of the light guide plate 840, a panel 870 located in front of the second prism sheet 860, and a color filter 880 located in front of the panel 870.

The light-emitting module may include a light-emitting element 835 placed on a circuit board 830, and may correspond to the above-described light-emitting module 100A, 100B, 100C or 100D shown in FIG. 1, 2, 8, or 9.

The bottom cover 810 may accommodate constituent elements inside the display apparatus 800. The reflector 820 may be provided as a separate element as illustrated in FIG. 11, or may be formed by coating the back surface of the light guide plate 840 or the front surface of the bottom cover 810 with a highly reflective material.

Here, the reflector 820 may be formed of a material that has high reflectance and may be used in an ultra thin form. The reflector 820 may be formed of polyethylene terephthalate (PET).

The light guide plate 840 scatters light emitted from the light-emitting module, thus causing the light to be uniformly distributed throughout the overall area of the screen of a liquid crystal display apparatus. Accordingly, the light guide plate 840 may be formed of a material that has a high index of refraction and a high transmittance. The light guide plate 840 may be formed of, for example, polymethylmethacrylate (PMMA), polycarbonate (PC) or polyethylene (PE). In addition, the light guide plate may be omitted and an air guide structure for transmitting light in the space above the reflecting sheet 820 may be possible.

The first prism sheet 850 is formed on one surface of a support film using an elastic polymer material having light transmittance. The polymer material may include a prism layer in which a plurality of stereoscopic structures is repeatedly formed. Here, the multiple patterns, as illustrated, may be arranged in stripes in which valleys and ridges are repeated.

In the second prism sheet 860, the directions in which ridges and valleys are formed on one surface of a support film may be perpendicular to the directions in which the ridges and valleys are formed on one surface of the support film in the first prism sheet 850. This serves to uniformly distribute the light transmitted from the light-emitting module and the reflecting sheet to the panel 870 in all directions.

In the present embodiment, the first prism sheet 850 and the second prism sheet 860 form an optical sheet. The optical sheet may be any of different combinations, for example, a micro-lens array, a combination of a diffuser sheet and a micro-lens array, or a combination of a single prism sheet and a micro-lens array.

The panel 870 may be a liquid crystal display panel, and a different kind of display apparatus, which requires a light source, may be provided, rather than the liquid crystal display panel.

The panel 870 is configured such that liquid crystals are located between glass bodies, and in order to use the deflection of light, polarizers are disposed on both the glass bodies. Here, the properties of the liquid crystals are intermediate to those of a liquid and a solid, and the liquid crystals, which are organic molecules having fluidity like liquid, are regularly arranged like crystals, and display an image using the arrangement of molecules, which is changed by an external electric field.

The liquid crystal display panel used in the display apparatus is of an active-matrix type, and uses a transistor as a switch that adjusts the voltage to be supplied to each pixel.

The color filter 880 may be provided on the front surface of the panel 870, and may show an image from the light that has passed through the panel 870 because respective pixels transmit only red, green and blue light.

Although the exemplary embodiments have been illustrated and described as above, it will of course be apparent to those skilled in the art that the embodiments are provided to assist understanding and the embodiments are not limited to the above description, and various modifications and variations can be made in the embodiments without departing from the spirit or scope of the disclosure, and the modifications and variations should not be understood individually from the viewpoint or scope of the disclosure so long as they include the constituent elements set forth in the claims.

MODE FOR INVENTION

Embodiments for implementation of this disclosure have sufficiently described in the above "Best Mode".

INDUSTRIAL APPLICABILITY

The light-emitting module 100A, 100B, 100C and 100D according to the above-described embodiments may be applied to various fields, such as a lighting apparatus or a display apparatus.

The invention claimed is:
1. A light-emitting module, comprising:
   $(1\text{-}1)^{st}$ to $(1\text{-}M)^{th}$ light-emitting elements connected to one another (where, "M" is a positive integer that is equal to or greater than 2);
   $(2\text{-}1)^{st}$ to $(2\text{-}N)^{th}$ light-emitting elements connected in parallel with a $(1\text{-}m)^{th}$ light-emitting element ($1 \leq m \leq M$), which is one of the $(1\text{-}1)^{st}$ to $(1\text{-}M)^{th}$ light-emitting elements (where, "N" is a positive integer that is equal to or greater than 1); and an on/off controller controlling to turn the $(1\text{-}1)^{st}$ to $(1\text{-}M)^{th}$ light-emitting elements and the $(2\text{-}1)^{st}$ to $(2\text{-}N)^{th}$ light-emitting elements on or off based on a level of a driving signal, wherein the on/off controller includes:

a first on/off control unit controlling to turn the $(1\text{-}m)^{th}$ light-emitting element and the $(2\text{-}1)^{st}$ to $(2\text{-}N)^{th}$ light-emitting elements on or off; and a second on/off control unit controlling to turn the remaining light-emitting elements on or off, excluding the $(1\text{-}m)^{th}$ light-emitting element, among the $(1\text{-}1)^{st}$ to $(1\text{-}M)^{th}$ light-emitting elements, wherein the first on/off control unit compensates for variation in second current, which flows through the $(2\text{-}1)^{st}$ to $(2\text{-}N)^{th}$ light-emitting elements, depending on temperature, in connection with first current, which flows through the $(1\text{-}m)^{th}$ light-emitting element, wherein the first on/off control unit includes:

a thermistor connected in parallel with the $(1\text{-}m)^{th}$ light-emitting element;

a first level comparator comparing a level of the driving signal with a level of a first reference voltage; and a first current controller forming a path, along which current flows from the $(2\text{-}1)^{st}$ to $(2\text{-}N)^{th}$ light-emitting elements to the thermistor in response to a result of the comparison by the first level comparator.

2. The module according to claim 1, wherein the first current controller includes a first transistor, and wherein the first transistor includes:

a drain connected to a cathode of the $(2\text{-}N)^{th}$ light-emitting element;

a gate associated with the result of the comparison by the first level comparator; and a source connected to the thermistor.

3. The module according to claim 1, wherein the second on/off control unit includes:

second to $M^{th}$ level comparators comparing the driving signal with second to $M^{th}$ reference voltages; and second to $M^{th}$ current controllers, each of which forms a path, along which current flows from the $(1\text{-}1)^{st}$ to $(1\text{-}M)^{th}$ light-emitting elements to a reference potential, in response to results of comparisons by the second to $M^{th}$ level comparators.

4. The module according to claim 3, further comprising a sensing resistor connected between the second to $M^{th}$ current controllers and the reference potential.

5. The module according to claim 4, wherein the second to $M^{th}$ current controllers include second to $M^{th}$ transistors respectively, and wherein each of the second to $M^{th}$ transistors includes:

a drain connected to a cathode of a corresponding light-emitting element of the remaining light-emitting elements excluding the $(1\text{-}m)^{th}$ light-emitting element among the $(1\text{-}1)^{st}$ to $(1\text{-}M)^{th}$ light-emitting elements;

a gate associated with a result of a comparison by a corresponding level comparator among the second to $M^{th}$ level comparators; and a source connected to the sensing resistor.

6. The module according to claim 1, wherein the second on/off control unit includes:

second to $M^{th}$ level comparators comparing the driving signal with second to $M^{th}$ reference voltages;

second to $(M\text{-}1)^{st}$ current controllers, each of which bypasses a path, along which current flows to at least some of the remaining light-emitting elements excluding the $(1\text{-}m)^{th}$ light-emitting element among the $(1\text{-}1)^{st}$ to $(1\text{-}M)^{th}$ light-emitting elements, in response to results of comparisons by the second to $M^{th}$ level comparators; and an $M^{th}$ current controller forming a path, along which current flows from the $(1\text{-}M)^{th}$ light-emitting element to a reference potential, in response to a result of a comparison by the $M^{th}$ level comparator.

7. The module according to claim 6, further comprising a connection resistor connected to an output of at least some of the remaining light-emitting elements excluding the $(1\text{-}m)^{th}$ light-emitting element among the $(1\text{-}1)^{st}$ to $(1\text{-}M)^{th}$ light-emitting elements.

8. The module according to claim 6, wherein the second to $M^{th}$ current controllers include second to $M^{th}$ transistors respectively, and wherein each of the second to $(M\text{-}1)^{st}$ transistors includes:

a drain and a source respectively connected to an anode and a cathode of at least some of the remaining light-emitting elements excluding the $(1\text{-}m)^{th}$ light-emitting element among the $(1\text{-}1)^{st}$ to $(1\text{-}M\text{-}1)^{st}$ light-emitting elements; and a gate associated with a result of a comparison by a corresponding level comparator among the second to $(M\text{-}1)^{st}$ level comparators.

9. The module according to claim 6, wherein the $M^{th}$ transistor includes:

a drain and a source connected respectively to a cathode of the $(1\text{-}M)^{th}$ light-emitting element and the reference potential; and a gate associated with a result of a comparison by the $M^{th}$ level comparator.

10. The module according to claim 1, wherein the $(1\text{-}1)^{st}$ to $(1\text{-}M)^{th}$ light-emitting elements are connected in series with each other, and the $(2\text{-}1)^{st}$ to $(2\text{-}N)^{th}$ light-emitting elements are connected in series with each other.

11. The module according to claim 1, wherein the $(1\text{-}m)^{th}$ light-emitting element is turned on first, among the $(1\text{-}1)^{st}$ to $(1\text{-}M)^{th}$ light-emitting elements.

12. The module according to claim 1, wherein the $(1\text{-}1)^{st}$ to $(1\text{-}m)^{th}$ light-emitting elements emit greenish white light, and the $(2\text{-}1)^{st}$ to $(2\text{-}N)^{th}$ light-emitting elements emit red light.

13. The module according to claim 3, wherein the first to $M^{th}$ level comparators and the first to $M^{th}$ current controllers form an integrated circuit in integral form.

14. The module according to claim 1, further comprising a rectifier for rectifying the driving signal, which is of an alternating current (AC) type, and converting the driving signal into a ripple driving signal.

15. The module according to claim 14, wherein the rectifier includes a full-wave diode bridge circuit for converting the AC-type driving signal into the ripple driving signal.

16. The module according to claim 1, wherein the $(1\text{-}1)^{st}$ to $(1\text{-}M)^{th}$ light-emitting elements are arranged in a circular plan form.

17. The module according to claim 16, wherein the $(2\text{-}1)^{st}$ to $(2\text{-}N)^{th}$ light-emitting elements are equidistantly arranged between the $(1\text{-}1)^{st}$ to $(1\text{-}M)^{th}$ light-emitting elements arranged in the circular plan form.

18. The module according to claim 16, wherein the $(2\text{-}1)^{st}$ to $(2\text{-}N)^{th}$ light-emitting elements are disposed inside a circular plan in which the $(1\text{-}1)^{st}$ to $(1\text{-}M)^{th}$ light-emitting elements are disposed.

19. The module according to claim 6, further comprising a sensing resistor connected between the $M^{th}$ current controller and the reference potential.

20. A light-emitting module, comprising:

$(1-1)^{st}$ to $(1-M)^{th}$ light-emitting elements connected to one another (where, "M" is a positive integer that is equal to or greater than 2);

$(2-1)^{st}$ to $(2-N)^{th}$ light-emitting elements connected in parallel with a $(1-m)^{th}$ light-emitting element ($1 \leq m \leq M$), which is one of the $(1-1)^{st}$ to $(1-M)^{th}$ light-emitting elements (where, "N" is a positive integer that is equal to or greater than 1); and an on/off controller controlling to turn the $(1-1)^{st}$ to $(1-M)^{th}$ light-emitting elements and the $(2-1)^{st}$ to $(2-N)^{th}$ light-emitting elements on or off based on a level of a driving signal, wherein the on/off controller includes:

a first on/off control unit controlling to turn the $(1-m)^{th}$ light-emitting element and the $(2-1)^{st}$ to $(2-N)^{th}$ light-emitting elements on or off; and a second on/off control unit controlling to turn the remaining light-emitting elements on or off, excluding the $(1-m)^{th}$ light-emitting element, among the $(1-1)^{st}$ to $(1-M)^{th}$ light-emitting elements, wherein the first on/off control unit compensates for variation in second current, which flows through the $(2-1)^{st}$ to $(2-N)^{th}$ light-emitting elements, depending on temperature, in connection with first current, which flows through the $(1-m)^{th}$ light-emitting element, wherein the first on/off control unit includes:

a thermistor connected in parallel with the $(1-m)^{th}$ light-emitting element;

a first level comparator comparing a level of the driving signal with a level of a first reference voltage; and a first current controller forming a path, along which current flows from the $(2-1)^{st}$ to $(2-N)^{th}$ light-emitting elements to the thermistor in response to a result of the comparison by the first level comparator, wherein the $(1-m)^{th}$ light-emitting diode element is turned on first, among the $(1-1)^{st}$ to $(1-M)^{th}$ light-emitting diode elements, wherein the $(2-1)^{st}$ to $(2-N)^{th}$ light-emitting diode elements emit red light, and wherein a resistance value of the thermistor decreases as the temperature increases.

* * * * *